United States Patent
Lof et al.

(10) Patent No.: US 7,213,963 B2
(45) Date of Patent: May 8, 2007

(54) LITHOGRAPHIC APPARATUS AND DEVICE MANUFACTURING METHOD

(75) Inventors: Joeri Lof, Eindhoven (NL); Erik Theodorus Maria Bijlaart, Rosmalen (NL); Roelof Aeilko Siebrand Ritsema, Eindhoven (NL); Frank Van Schaik, Eindhoven (NL); Timotheus Franciscus Sengers, s-Hertogenbosch (NL); Klaus Simon, Eindhoven (NL); Joannes Theodoor De Smit, Eindhoven (NL); Arie Jeffrey Maria Den Boef, Waalre (NL); Hans Butler, Best (NL); Sjoerd Nicolaas Lambertus Donders, s-Hertogenbosch (NL); Christiaan Alexander Hoogendam, Veldhoven (NL); Marcus Adrianus Van de Kerkhof, Helmond (NL); Aleksey Yurievich Kolesnychenko, Helmond (NL); Mark Kroon, Utrecht (NL); Erik Roelof Loopstra, Heeze (NL); Hendricus Johannes Maria Meijer, Veldhoven (NL); Jeroen Johannes Sophia Maria Mertens, Duizel (NL); Johannes Catharinus Hubertus Mulkens, Waalre (NL); Joost Jeroen Ottens, Veldhoven (NL); Alexander Straaijer, Eindhoven (NL); Bob Streefkerk, Tilburg (NL); Helmar Van Santen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 160 days.

(21) Appl. No.: 10/857,614

(22) Filed: Jun. 1, 2004

(65) Prior Publication Data

US 2005/0264778 A1 Dec. 1, 2005

(30) Foreign Application Priority Data

| Jun. 9, 2003 | (EP) | ................... 03253636 |
| Aug. 29, 2003 | (EP) | ................... 03255395 |
| Nov. 10, 2003 | (EP) | ................... 03257068 |

(51) Int. Cl.
- G03B 27/42 (2006.01)
- G03B 27/74 (2006.01)
- G03B 27/72 (2006.01)
- G03B 27/32 (2006.01)
- G00B 1/00 (2006.01)

(52) U.S. Cl. ............................ 366/53; 355/68; 355/72; 355/77; 356/400

(58) Field of Classification Search .................. 355/30, 355/53, 55, 72, 77, 68; 356/399, 400, 401; 250/548

See application file for complete search history.

(56) References Cited

U.S. PATENT DOCUMENTS 3,573,975 A 4/1971 Dhaka et al. ................ 117/212

(Continued)

FOREIGN PATENT DOCUMENTS

DE 206 607 2/1984

(Continued)

OTHER PUBLICATIONS

U.S. Appl. No. 10/820,227, filed Apr. 8, 2004, De Smit.

(Continued)

*Primary Examiner*—Alan Mathews
(74) *Attorney, Agent, or Firm*—Pillsbury Winthrop Shaw Pittman LLP

(57) ABSTRACT

A lithographic projection apparatus is disclosed in which a space between the projection system and a sensor is filled with a liquid.

28 Claims, 10 Drawing Sheets

U.S. PATENT DOCUMENTS

| | | | | |
|---|---|---|---|---|
| 3,648,587 | A | 3/1972 | Stevens | 95/44 |
| 4,346,164 | A | 8/1982 | Tabarelli et al. | 430/311 |
| 4,390,273 | A | 6/1983 | Loebach et al. | 355/125 |
| 4,396,705 | A | 8/1983 | Akeyama et al. | 430/326 |
| 4,480,910 | A | 11/1984 | Takanashi et al. | 355/30 |
| 4,509,852 | A | 4/1985 | Tabarelli et al. | 355/30 |
| 4,540,277 | A * | 9/1985 | Mayer et al. | 355/53 |
| 5,040,020 | A | 8/1991 | Rauschenbach et al. | 355/53 |
| 5,121,256 | A | 6/1992 | Corle et al. | 359/664 |
| 5,610,683 | A | 3/1997 | Takahashi | 355/53 |
| 5,715,039 | A | 2/1998 | Fukuda et al. | 355/53 |
| 5,825,043 | A | 10/1998 | Suwa | 250/548 |
| 5,900,354 | A | 5/1999 | Batchelder | 430/395 |
| 6,191,429 | B1 | 2/2001 | Suwa | 250/548 |
| 6,236,634 | B1 | 5/2001 | Lee et al. | 369/112 |
| 6,560,032 | B2 | 5/2003 | Hatano | 359/656 |
| 6,600,547 | B2 | 7/2003 | Watson et al. | |
| 6,603,130 | B1 | 8/2003 | Bisschops et al. | 250/492.1 |
| 6,633,365 | B2 | 10/2003 | Suenaga | 355/53 |
| 2002/0020821 | A1 | 2/2002 | Van Santen et al. | 250/492 |
| 2002/0037461 | A1* | 3/2002 | Van Der Werf et al. | 430/30 |
| 2002/0163629 | A1 | 11/2002 | Switkes et al. | 355/53 |
| 2003/0123040 | A1* | 7/2003 | Almogy | 355/69 |
| 2003/0174408 | A1 | 9/2003 | Rostalski et al. | 359/642 |
| 2004/0000627 | A1 | 1/2004 | Schuster | |
| 2004/0021844 | A1 | 2/2004 | Suenaga | |
| 2004/0075895 | A1 | 4/2004 | Lin | 359/380 |
| 2004/0109237 | A1 | 6/2004 | Epple et al. | |
| 2004/0119954 | A1 | 6/2004 | Kawashima et al. | 355/30 |
| 2004/0125351 | A1 | 7/2004 | Krautschik et al. | 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0605103 A1 | 7/1994 |
| EP | 1039511 | 9/2000 |
| EP | 1 182 511 A1 * | 2/2002 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057295 A2 | 7/2004 |
| WO | WO 2004/057589 A1 | 7/2004 |
| WO | WO 2004/057590 A1 | 7/2004 |
| WO | WO 2005/010611 A2 | 2/2005 |

OTHER PUBLICATIONS

U.S. Appl. No. 10/860,662, filed Jun. 4, 2004, De Smit.
U.S. Appl. No. 10/888,514, filed Jul. 12, 2004, Sengers et al.
U.S. Appl. No. 10/698,012, filed Oct. 31, 2003, Flagello et al.
U.S. Appl. No. 10/705,804, filed Nov. 12, 2003, De Smit et al.
U.S. Appl. No. 10/705,805, filed Nov. 12, 2003, Lof et al.
U.S. Appl. No. 10/705,783, filed Nov. 12, 2003, Lof et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/705,785, filed Nov. 12, 2003, Derksen et al.
U.S. Appl. No. 10/724,402, filed Dec. 1, 2003, Simon et al.
U.S. Appl. No. 10/715,116, filed Nov. 18, 2003, Bleeker.
U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/775,326, filed Feb. 11, 2004, Dierichs.
U.S. Appl. No. 10/367,910, filed Feb. 19, 2003, Suwa et al.
U.S. Appl. No. 10/924,202, filed Aug. 24, 2004, Sengers et al.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
G. Owen et al., "⅛μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).
European Search Report for EP Patent Application No. 03257068.1, dated May 3, 2004.

European Search Report for EP Patent Application No. 03255395.0, dated Aug. 19, 2004.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

* cited by examiner

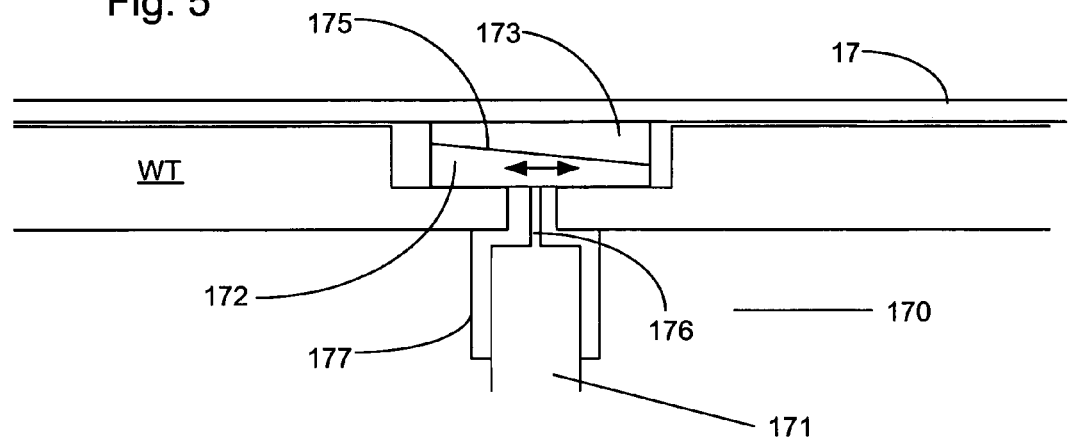
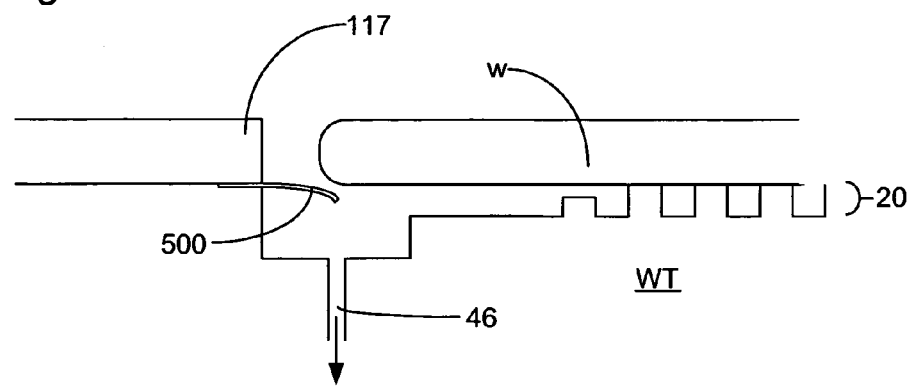

TIS ADC

LITHOGRAPHIC APPARATUS AND DEVICE MANUFACTURING METHOD

This application claims priority from European patent applications EP 03253636.9, filed Jun. 9, 2003, EP 03255395.0, filed Aug. 29, 2003, and EP 03257068.1, filed Nov. 10, 2003, each of which is herein incorporated in its entirety by reference.

FIELD

The present invention relates to a lithographic projection apparatus and a device manufacturing method.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronics. In both of the situations described hereabove, the patterning device can comprise one or more programmable mirror arrays. More information on mirror arrays as here referred to can be gleaned, for example, from United States patents U.S. Pat. No. 5,296,891 and U.S. Pat. No. 5,523,193, and PCT patent application publications WO 98/38597 and WO 98/33096, which are incorporated herein by reference.

In the case of a programmable mirror array, the support structure may be embodied as a frame or table, for example, which may be fixed or movable as required.

A programmable LCD array. An example of such a construction is given in United States patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from United States patent U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in United States patent U.S. Pat. No. 5,969,441 and PCT patent application publication WO 98/40791, incorporated herein by reference.

It has been proposed to immerse the substrate in a lithographic projection apparatus in a liquid having a relatively high refractive index, e.g. water, so as to fill the space between the final optical element of the projection system and the substrate. The point of this is to enable imaging of smaller features because the exposure radiation will have a shorter wavelength in the liquid than in gas (e.g., air) or in a vacuum. (The effect of the liquid may also be regarded as increasing the effective NA of the system).

However, submersing the substrate or substrate and substrate table in a bath of liquid (see for example United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application publication WO 99/49504, hereby incorporated in its entirety by reference. As illustrated in FIGS. 14 and 15, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 15 shows the arrangement schematically in which liquid is supplied via inlet IN and is taken up on the other side of the element by outlet OUT which is connected to a low pressure source. In the illustration of FIG. 14 the liquid is supplied along the direction of movement of the substrate relative to the final element, though this does not need to be the case. Various orientations and numbers of inlets and out-lets positioned around the final element are possible, one example is illustrated in FIG. 23 in which four sets of an inlet with an outlet on either side are provided in a regular pattern around the final element.

SUMMARY

Accordingly, it would be advantageous, for example, to provide an immersion lithographic projection apparatus with improved functionality.

According to an aspect of the invention, there is provided a lithographic projection apparatus comprising:
an illuminator adapted to condition a beam of radiation;
a support structure configured to hold a patterning device, the patterning device configured to pattern the beam of radiation according to a desired pattern;
a substrate table configured to hold a substrate;
a projection system adapted to project the patterned beam onto a target portion of the substrate;
a liquid supply system configured to at least partly fill a space between the projection system and an object on the substrate table, with a liquid; and
a sensor capable of being positioned to be illuminated by the beam of radiation once it has passed through the liquid.

By passing a beam of radiation for a sensor through liquid, no elaborate measures need to be taken to compensate the signals from the sensor to take account of the parameters measured by the sensor being measured through a different medium to that which the substrate is imaged through. However, it may be necessary to ensure that the design of the sensor is such that it is compatible for use when covered with liquid. An example sensor includes an alignment sensor configured to align the substrate table relative to the projection system, a transmission image sensor, a focus sensor, a spot or dose sensor, an integrated lens interferometer and scanner sensor and even an alignment mark. In the case of an alignment sensor, the measurement gratings of the sensor may have a pitch than less than 500 nm, such pitch possibly improving the resolution of the alignment sensor.

According to a further aspect of the present invention, there is provided a device manufacturing method comprising:
projecting a beam of radiation through a liquid onto a sensor; and
projecting the beam of radiation as patterned using a projection system of a lithographic apparatus through the liquid onto a target portion of a substrate.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which corresponding reference symbols indicate corresponding parts:

FIG. 5 illustrates a detail of the second embodiment of the present invention;

FIG. 6a illustrates a first version of a third embodiment of the present invention;

DETAILED DESCRIPTION

Embodiment 1

Figure 1:
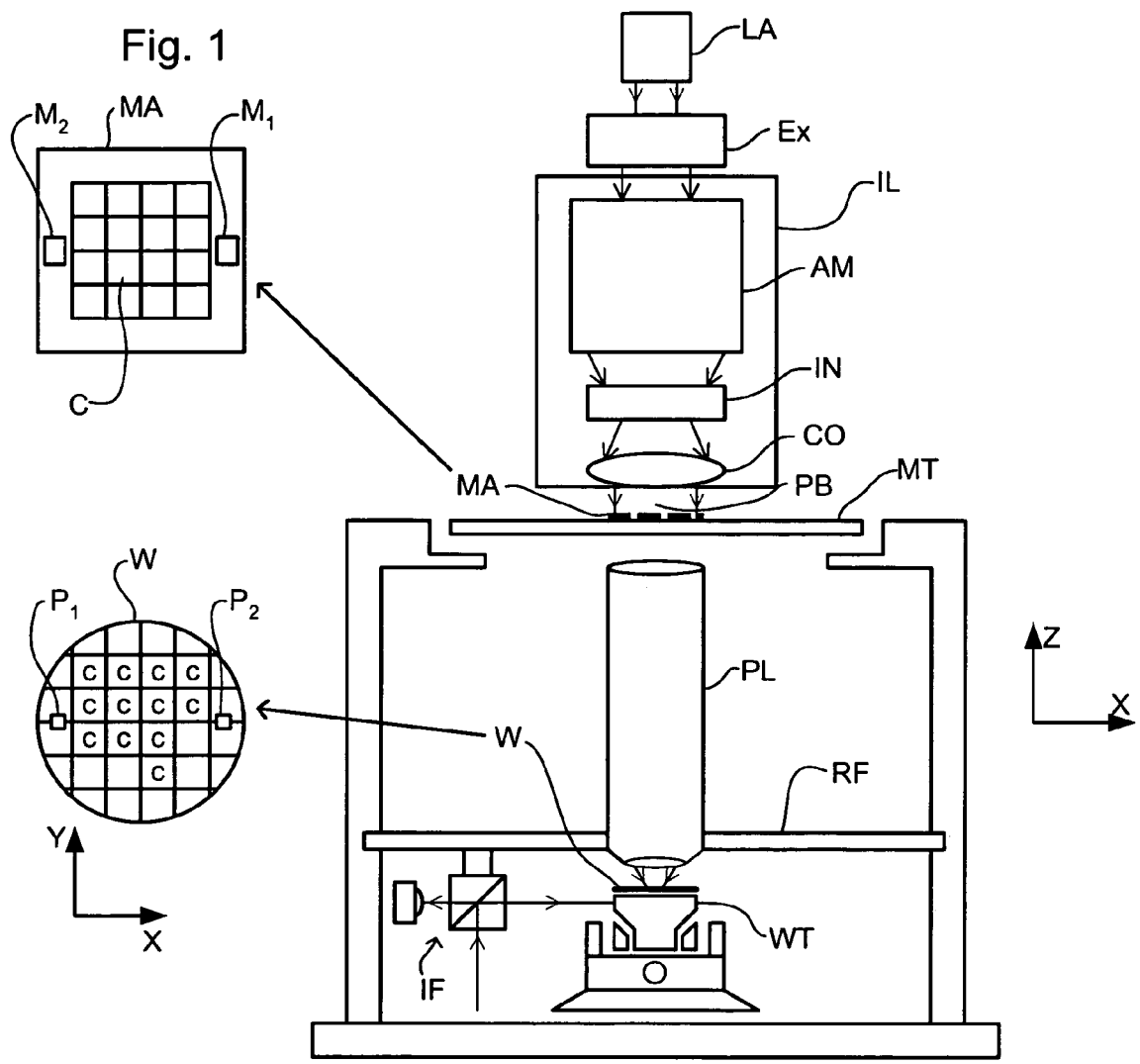
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to a first positioning device for accurately positioning the mask with respect to item PL;

a second object table (substrate table) WT provided with a substrate holder for holding a substrate W (e.g. a resist-coated silicon wafer), and connected to a second positioning device for accurately positioning the substrate with respect to item PL;

a projection system ("projection lens") PL (e.g. a refractive system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass at least both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning device (and interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 2:
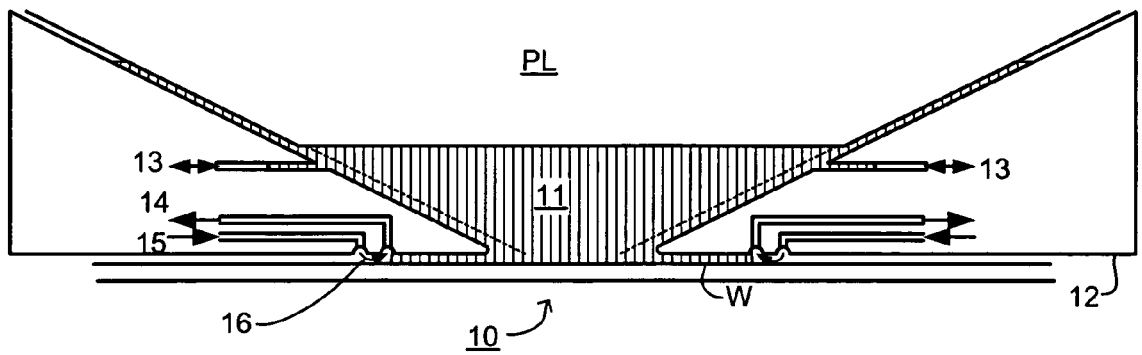
FIG. 2 depicts the liquid reservoir of a first embodiment of the invention.

FIG. 2 shows a liquid reservoir 10 between the projection system PL and the substrate W which is positioned on the substrate stage WT. The liquid reservoir 10 is filled with a liquid 11 having a relatively high refractive index, e.g. water or a suspension of particles in water, provided via inlet/outlet ducts 13. The liquid has the effect that the radiation of the projection beam is a shorter wavelength in the liquid than in gas (e.g., air) or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The reservoir 10 forms, in an embodiment, a contactless seal to the substrate W around the image field of the projection system PL so that the liquid is confined to fill the space between the substrate's primary surface, which faces the projection system PL, and the final optical element of the projection system PL. The reservoir is formed by a seal member 12 positioned below and surrounding the final element of the projection system PL. Thus, the liquid supply system provides liquid on only a localized area of the substrate. The seal member 12 forms part of the liquid supply system for filling the space between the final element of the projection system and the substrate with a liquid. This liquid is brought into the space below the projection system and within the seal member 12. In an embodiment, the seal member 12 extends a little above the bottom element of the projection system and the liquid rises above the final element so that a buffer of liquid is provided. The seal member 12 has an inner periphery that at the upper end closely conforms to the shape of the projection system or the final elements thereof and may, e.g. be round. At the bottom the inner periphery closely conforms to the shape of the image field, e.g. rectangular, though this is not necessarily so. The seal member is substantially stationary in the XY plane relative to the projection system though there may be some relative movement in the Z direction (in the direction of the optical axis). A seal is formed between the seal member and the surface of the substrate. In an implementation, this seal is a contactless seal and may be a gas seal.

The liquid 11 is confined in the reservoir 10 by a seal device 16. As illustrated in FIG. 2, the seal device is a contactless seal i.e. a gas seal. The gas seal is formed by gas, e.g. air or synthetic air, provided under pressure via inlet 15 to the gap between seal member 12 and substrate W and extracted by first outlet 14. The over pressure on the gas inlet 15, vacuum level or under pressure on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

Figure 14:
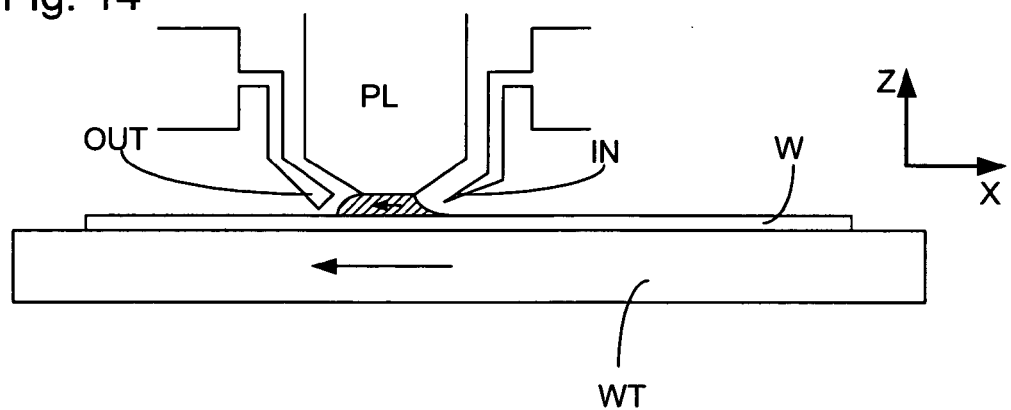
FIG. 14 illustrates an alternative liquid supply system according to an embodiment of the invention.
Figure 15:
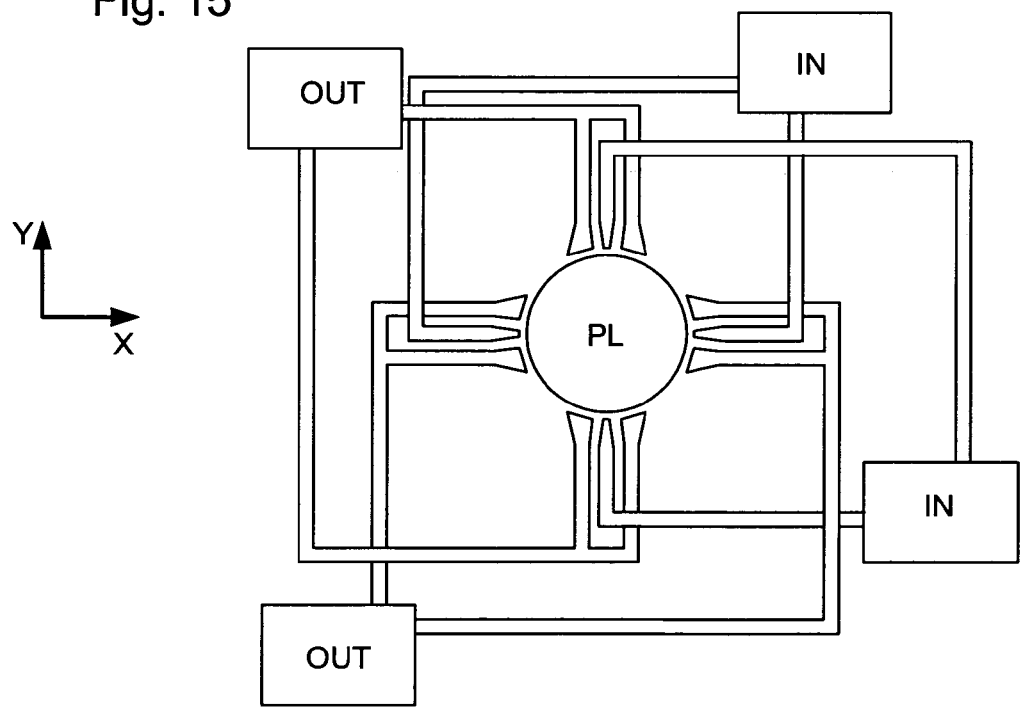
FIG. 15 illustrates, in plan, the system of FIG. 14.

FIGS. 14 and 15 also depict a liquid reservoir defined by inlet(s) IN, outlet(s) OUT, the substrate W and the final element of projection system PL. Like the liquid supply system of FIG. 2 the liquid supply system illustrated in FIGS. 14 and 15, comprising inlet(s) IN and outlet(s) OUT, supplies liquid to the primary surface of the substrate in a localized area between the final element of the projection system and the substrate and can suffer from loss of liquid at the substrate edge.

Thus, as used herein for the embodiments, the liquid supply system can comprise that as described in relation to FIG. 2 and FIGS. 14 and 15.

Embodiment 2

Figure 3:
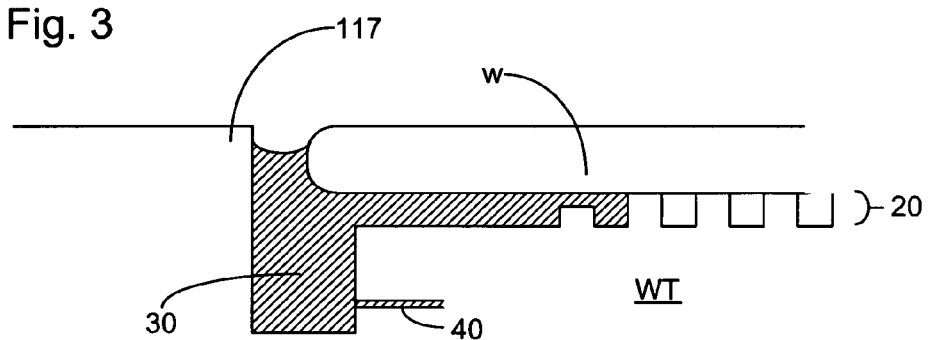
FIG. 3 illustrates a second embodiment of the invention.
Figure 4:
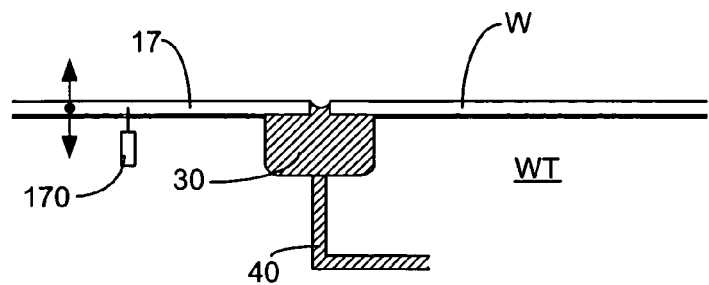
FIG. 4 illustrates an alternative form of the second embodiment of the present invention.

A second embodiment is illustrated in FIGS. 3 to 5 and is the same or similar as the first embodiment except as described below.

In the embodiment of FIGS. 3 and 4 an edge liquid supply system provides liquid to a reservoir 30 via a port 40. The liquid in the reservoir 30 is optionally the same as the immersion liquid in the liquid supply system. The reservoir 30 is positioned on the opposite side of the substrate W to the projection system PL and adjacent the edge of the substrate W and the edge of the edge seal member 17, 117. In FIG. 4, the edge seal member 17 is comprised of an element which is separate to the substrate table WT whereas in FIG. 3 the edge seal member 117 is provided by an integral portion of the substrate table WT. As can be seen most clearly from FIG. 3, the substrate W is supported on the substrate table WT by a so-called pimple table 20. The pimple table 20 comprises a plurality of projections on which the substrate W rests. The substrate W is held in place by, e.g., a vacuum source sucking the substrate onto the top surface of the substrate table WT. With the use of the reservoir 30, when the edge of the substrate W is being imaged, (i.e. when liquid in the liquid supply system between the projection system PL and the substrate W traverses across an edge of the substrate W), liquid cannot escape from the liquid supply system into the gap between the edge seal member 17, 117 and the substrate W because that space is already filled with liquid.

The mechanism 170 shown in FIG. 4 for moving the edge seal member 17 relative to the remainder of the substrate table WT is illustrated in detail in FIG. 5. The reason for moving the edge seal member 17 in this way is so that its primary surface can be made to be substantially co-planar with the primary surface of the substrate W. This allows a smooth movement of the liquid supply system over edge portions of the substrate W so that the bottom inner periphery of the liquid supply system can be moved to positions partly on the primary surface of substrate W and partly on the primary surface of the edge seal member 17.

A level sensor (not illustrated) is used to detect the relative heights of the primary surfaces of the substrate W and the edge seal member 17. Based on the results of the level sensor, control signals are sent to the actuator 171 in order to adjust the height of the primary surface of the edge seal member 17. A closed loop actuator could also be used for this purpose.

In an implementation, the actuator 171 is a rotating motor which rotates a shaft 176. The shaft 176 is connected to a circular disc at the end distal to the motor 171. The shaft 176 is connected away from the centre of the disc. The disc is located in a circular recess in a wedge portion 172. Ball bearings may be used to reduce the amount of friction between the circular disc and the sides of the recess in the wedge portion 172. The motor 171 is held in place by leaf springs 177. On actuation of the motor the wedge portion is driven to the left and right as illustrated (i.e. in the direction of the slope of the wedge portion) because of the excentre position of the shaft 176 in the disc. The motor is prevented from moving in the same direction as the direction of movement of the wedge portion 172 by the springs 177.

As the wedge portion 172 moves left and right as illustrated in FIG. 5, its top surface 175 (which is the surface of the wedge which is sloped in relation to the primary surface of the edge seal member 17) contacts the bottom sloped surface of a further wedge member 173 which is fixed to the bottom of the edge seal member 17. The edge seal member 17 is prevented from moving in the direction of movement of the wedge member 172 so that when the wedge member 172 moves left and right the edge seal member 17 is lowered and raised respectively. Some biasing of the edge seal member 17 towards the substrate table WT may be necessary.

Obviously the further wedge member 173 could be replaced by an alternative shape, for example a rod positioned perpendicularly to the direction of movement of the wedge 172. If the coefficient of friction between the wedge member 172 and the further wedge member 173 is greater than the tangent of the wedge angle then the actuator 170 is self-braking meaning that no force may be needed on the wedge member 172 to hold it in place. This is advantageous as the system will then be stable when the actuator 171 is not actuated. The accuracy of the mechanism 170 is of the order of a few μm.

Especially in the case of the edge seal member 117 being an integral part of the substrate table WT, a mechanism may be provided to adjust the height of the substrate W or the member supporting the substrate W so that the primary surfaces of the edge seal member 17, 117 and the substrate can be made substantially co-planar.

Embodiment 3

Figure 6B:
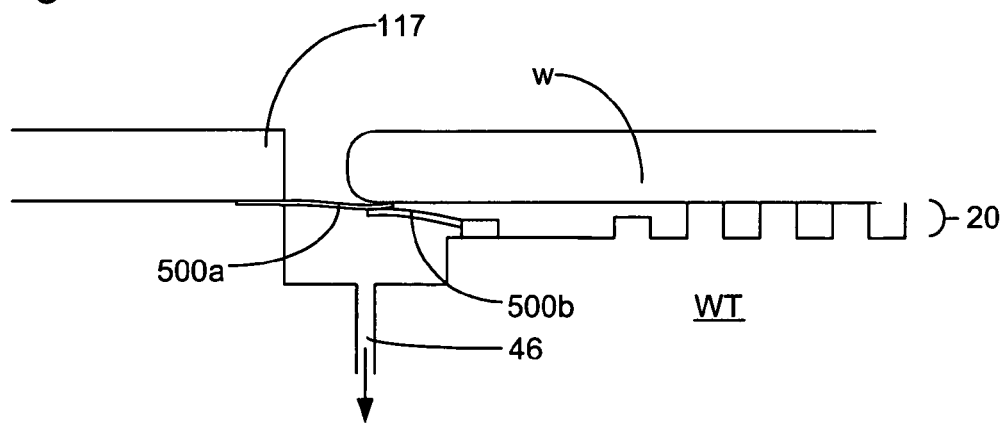
FIG. 6b illustrates a second version of the third embodiment.
Figure 6C:
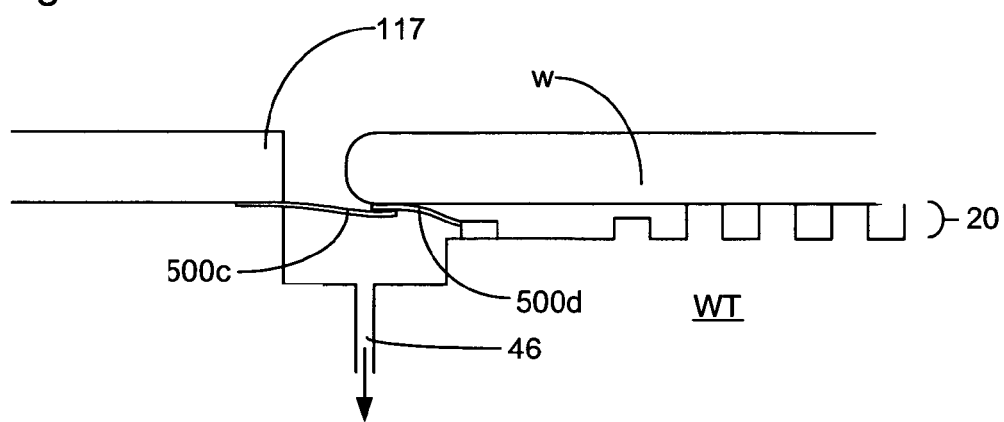
FIG. 6c illustrates a third version of the third embodiment.
Figure 7:
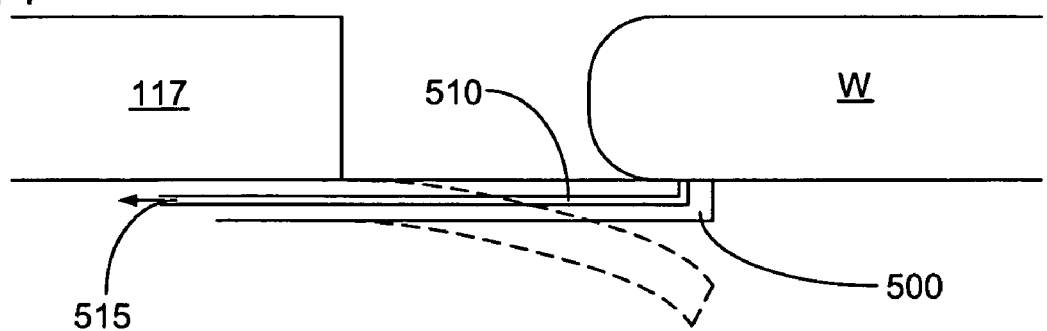
FIG. 7 illustrates in detail further aspects of the first version of the third embodiment of the present invention.

A third embodiment is illustrated in FIGS. 6 and 7 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

In a first version of this embodiment as illustrated in FIG. 6a, a further edge seal member 500 is used to bridge the gap between the edge seal member 117 and the substrate W. The further edge seal member is affixed to the edge seal member 117. The further edge seal member 500 is removably attachable against the surface of the substrate W opposite the primary surface. In this embodiment the further edge seal member 500 can be a flexible edge seal member which is actuatable to contact the under surface of the substrate W. When the flexible edge seal member 500 is deactivated it falls away from the substrate under gravity. The way this is achieved is illustrated in FIG. 7 and is described below.

It is likely that the further edge seal member 500 will not prevent all of the immersion liquid from the liquid supply system from entering the space under the substrate W and for this reason a port 46 connected to a low pressure source may be provided under the substrate W adjacent edges of the edge seal member 117 and the substrate W in some or all of the versions of this embodiment. Of course the design of the area under the substrate could be the same as that of the second embodiment.

The same system can be used for sensors such as a transmission image sensor (TIS) on the substrate table as opposed for the substrate W. In the case of sensors, as the sensors do not move, the further edge seal member 500 can be permanently attached to the sensor, for example using glue.

Furthermore, the further edge seal member 500 can be arranged to engage with the top surface of the object (that surface closest to the projection system) rather than the bottom surface. Also, the further edge seal member 500 may be provided attached to or near the top surface of the edge seal member 117 as opposed to under the edge seal member 117 as is illustrated in FIG. 6a.

A second version of this embodiment is illustrated in FIG. 6b. Two further edge seal members 500a, 500b are used. The first of these edge seal members 500a is the same as in the first version. The second of these edge seal members 500b is affixed to the substrate table 20 i.e. underneath the substrate W and extends with its free end radially outwardly from its attachment point. The second further edge seal member 500b clamps the first further edge seal member 500a against the substrate W. Compressed gas can be used to deform or move the second further edge seal member 500b.

A third version of this embodiment is shown in FIG. 6c. The third version is the same as the second version except the first further edge seal member 500c clamps the second further edge seal member 500d to the substrate W. This avoids, for example, the need for the compressed gas of the second version.

It will be appreciated that the embodiment will also work with only the second further edge seal member 500b, 500d with or without connection to vacuum.

Various ways of deforming the further edge seal members 500, 500a, 500b, 500c, 500d will now be described in relation to the first version of the embodiment.

As can be seen from FIG. 7, a channel 510 is formed in the elongate direction of a flexible further edge seal member 500 (which, in an implementation, is an annular ring) and (a) discrete port(s) are provided in an upper surface of the flexible further edge seal member which faces the projection system PL and the underside of the substrate W. By connecting a vacuum source 515 to the duct 510 the flexible further edge seal member can be made to abut the substrate W by suction. When the vacuum source 515 is disconnected or switched off, the flexible further edge seal member 500 drops under gravity and/or pressure from port 46 to assume the position shown in dotted lines in FIG. 7.

In an alternative or additional embodiment, a flexible further edge seal member 500 is formed with a mechanical pre-load such that it contacts the substrate W when the substrate is placed on the pimple table 20 and the flexible further edge seal member 500 deforms elastically so that it applies a force upwards on the substrate W to thereby make a seal.

In a further alternative or additional embodiment, a flexible further edge seal member 500 may be forced against the substrate W by an overpressure generated by pressurised gas on port 46.

A flexible further edge seal member 500 may be fashioned from any flexible, radiation and immersion liquid resistant, non-contaminating material, for example, steel, glass e.g. $Al_2O_3$, ceramic material e.g. SiC, Silicon, Teflon, low expansion glasses (e.g. Zerodur (TM) or ULE (TM)), carbon fibre epoxy or quartz and is typically between 10 and 500 μm thick, optionally between 30 and 200 μm or 50 to 150 μm in the case of glass. With a flexible further edge seal member 500 of this material and these dimensions, the typical pressure to be applied to the duct 510 is approximately 0.1 to 0.6 bar.

Embodiment 4

Figure 8:
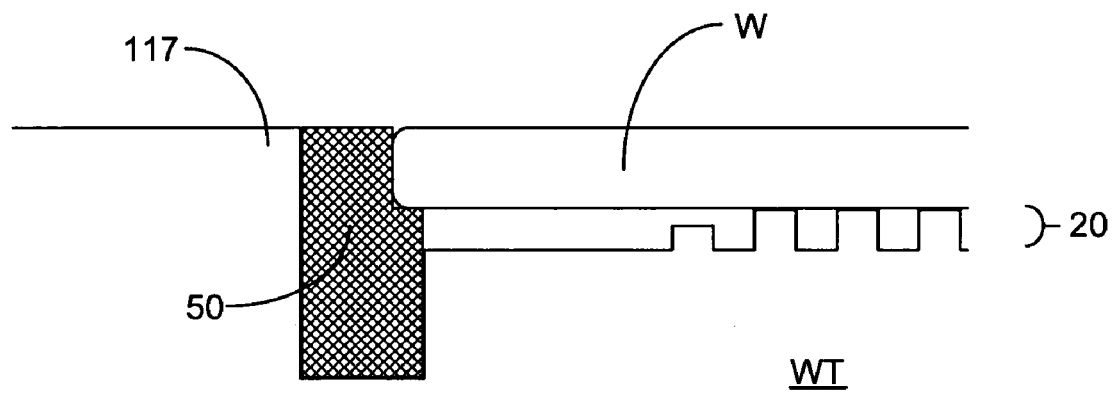
FIG. 8 illustrates a fourth embodiment of the present invention.

A fourth embodiment is illustrated in FIG. 8 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

In the fourth embodiment, the gap between the edge seal member 117 and the substrate W is filled with a further edge seal member 50. The further edge seal member is a flexible further edge seal member 50 which has a top surface which is substantially co-planar with the primary surfaces of the substrate W and the edge seal member 117. The flexible further edge seal member 50 is made of a compliant material so that minor variations in the diameter/width of substrate W and in the thickness of the substrate W can be accommodated by deflections of the flexible further edge seal member 50. When liquid in the liquid supply system under the projection system PL passes over the edge of the substrate, the liquid cannot escape between the substrate W, flexible further edge seal member 50 and edge seal member 117 because the edges of those elements are tight against one another. Furthermore, because the primary surfaces of the substrate W and the edge seal member 117 and the top surface of the flexible further edge seal member 50 are substantially co-planar, the liquid supply system operation is not upset when it passes over the edge of the substrate W so that disturbance forces are not generated in the liquid supply system.

As can be seen from FIG. 8, the flexible further edge seal member 50 is in contact with a surface of the substrate W opposite the primary surface of the substrate W, at an edge portion. This contact has two functions. First, the fluid seal between the flexible further edge seal member 50 and the substrate W may be improved. Second, the flexible further edge seal member 50 applies a force on the substrate W in a direction away from the pimple table 20. When the substrate W is held on the substrate table WT by, e.g. vacuum suction, the substrate can be held securely on the substrate table. However, when the vacuum source is switched off or disconnected, the force produced by the flexible further edge seal member 50 on the substrate W is effective to push the substrate W off the substrate table WT thereby aiding loading and unloading of substrates W.

The flexible further edge seal member 50 is made of a radiation and immersion liquid resistant material such as PTFE.

Embodiment 5

Figure 9:
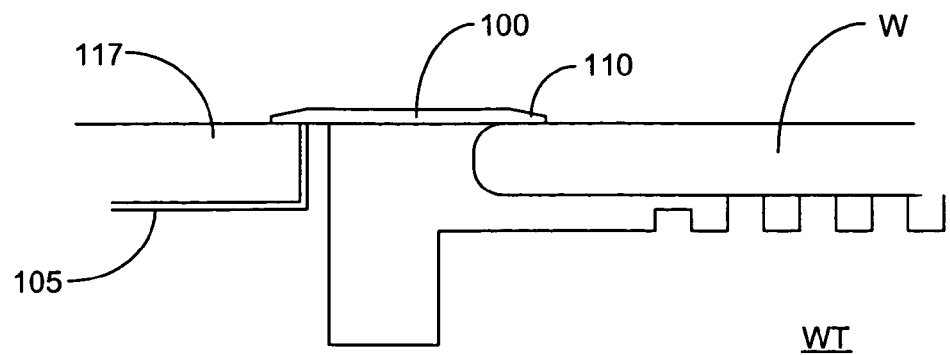
FIG. 9 illustrates an fifth embodiment of the present invention.

FIG. 9 illustrates a fifth embodiment which is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

As can be seen from FIG. 9, the eighth embodiment includes a further edge seal member 100 for bridging the gap between the edge seal member 117 and the substrate W. In this case the further edge seal member 100 is a gap seal member which is positioned on the primary surfaces of the substrate W and the edge seal member 117 to span the gap between the substrate W and edge seal member 117. Thus, if the substrate W is circular, the gap seal member 100 will also be circular (annular).

The gap seal member 100 may be held in place by the application of a vacuum 105 to its underside (that is a vacuum source exposed through a vacuum port on the primary surface of the edge seal member 117). The liquid supply system can pass over the edge of the substrate W without the loss of liquid because the gap between the substrate W and the edge seal member 117 is covered over by the gap seal member 100. The gap seal member 100 can be put in place and removed by the substrate handler so that standard substrates and substrate handling can be used. Alternatively the gap seal member 100 can be kept at the projection system PL and put in place and removed by appropriate mechanisms (e.g. a substrate handling robot). The gap seal member 100 should be stiff enough to avoid deformation by the vacuum source. Advantageously the gap seal member 100 is less than 50, optionally 30 or 20 or even 10 µm thick to avoid contact with the liquid supply system, but should be made as thin as possible The gap seal member 100 is advantageously provided with tapered edges 110 in which the thickness of the gap seal member 100 decreases towards the edges. This gradual transition to the full thickness of the gap seal member ensures that disturbance of the liquid supply system is reduced when it passes on top of the gap seal member 100.

The same way of sealing may be used for other objects such as sensors, for example transmission image sensors. In this case, as the object is not required to move, the gap seal member 100 can be glued in place (at either end) with a glue which does not dissolve in the immersion liquid. The glue can alternatively be positioned at the junction of the edge seal member 117, the object and the gap seal member 100.

Furthermore, the gap seal member 100 can be positioned underneath the object and an overhang of the edge seal member 117. The object may be shaped with an overhang also, if necessary.

The gap seal member 100, whether above or below the object, can have a passage provided through it, from one opening in a surface in contact with the edge seal member 117 to another opening in a surface in contact with the object. By positioning one opening in fluid communication with vacuum 105, the gap seal member 100 can then be kept tightly in place.

Embodiment 6

Figure 10:
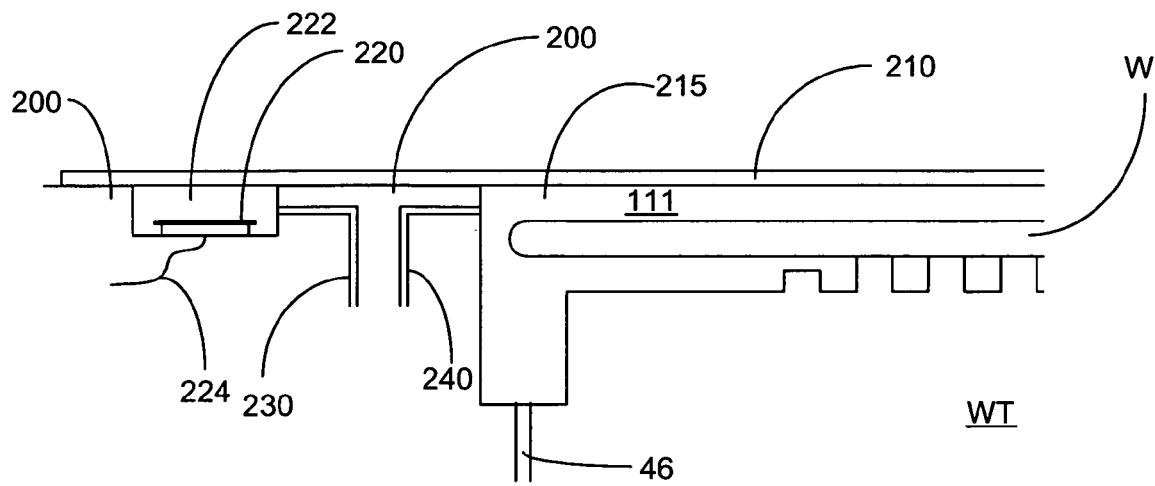
FIG. 10 illustrates a sixth embodiment of the present invention.

A sixth embodiment will be described with reference to FIG. 10. The solution shown in FIG. 10 bypasses some of the problems associated with imaging edge portions of the substrate W as well as allows a transmission image sensor (TIS) 220 (or other sensor or object) to be illuminated by the projection system PL under the same conditions as the substrate W.

The sixth embodiment uses the liquid supply system described with respect to the first embodiment. However, rather than confining the immersion liquid in the liquid supply system under the projection system PL on its lower side with the substrate W, the liquid is confined by an intermediary plate 210 which is positioned between the liquid supply system and the substrate W. The spaces 222, 215 between the intermediary plate 210 and the TIS 220 and the substrate W are also filled with liquid 111. This may either be done by two separate space liquid supply systems via respective ports 230, 240 as illustrated or by the same space liquid supply system via ports 230, 240. Thus the space 215 between the substrate W and the intermediary plate 210 and the space 220 between the transmission image sensor 220 and the intermediary plate 210 are both filled with liquid and both the substrate W and the transmission image sensor can be illuminated under the same conditions. Portions 200 provide a support surface or surfaces for the intermediary plate 210 which may be held in place by vacuum sources.

The intermediary plate 210 is made of such a size that it covers all of the substrate W as well as the transmission image sensor 220. Therefore, no edges need to be traversed by the liquid supply system even when the edge of the substrate W is imaged or when the transmission image sensor is positioned under the projection system PL. The top surface of the transmission image sensor 220 and the substrate W are substantially co-planar.

The intermediary plate 210 can be removable. It can, for example, be put in place and removed by a substrate handling robot or other appropriate mechanism.

All of the above described embodiments may be used to seal around the edge of the substrate W. Other objects on the substrate table WT may also need to be sealed in a similar way, such as sensors including sensors and/or marks which are illuminated with the projection beam through the liquid such as a transmission image sensor, integrated lens interferometer and scanner (wavefront sensor) and a spot sensor plate. Such objects may also include sensors and/or marks which are illuminated with non-projection radiation beams such as levelling and alignment sensors and/or marks. The liquid supply system may supply liquid to cover all of the object in such a case. Any of the above embodiments may be used for this purpose. In some instances, the object will not need to be removed from the substrate table WT as, in contrast to the substrate W, the sensors do not need to be removed from the substrate table WT. In such a case the above embodiments may be modified as appropriate (e.g. the seals may not need to be moveable).

Embodiment 7

Figure 11:
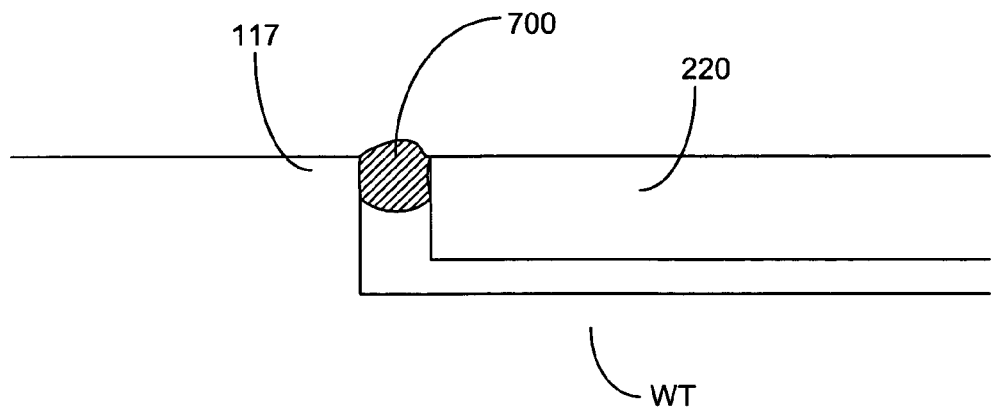
FIG. 11 illustrates a seventh embodiment of the present invention.

FIG. 11 shows a seventh embodiment which is the same as the first embodiment except as described below.

In the seventh embodiment the object on the substrate table WT is a sensor 220 such as a transmission image sensor (TIS). In order to prevent immersion liquid seeping underneath the sensor 220, a bead of glue 700 which is undissolvable and unreactable with the immersion fluid is positioned between the edge seal member 117 and the sensor 220. The glue is covered by immersion fluid in use.

Embodiment 8

An eighth embodiment is described with reference to FIGS. 12 and 13. In the eighth embodiment it is a sensor 220 which is being sealed to the substrate table WT. In both versions illustrated in FIGS. 12 and 13, a vacuum 46 is provided adjacent the gap with an opening passage 47 and a chamber 44 for taking away any immersion liquid which should find its way through the gap between the edge seal member 117 and the edge of the sensor 220.

Figure 12:
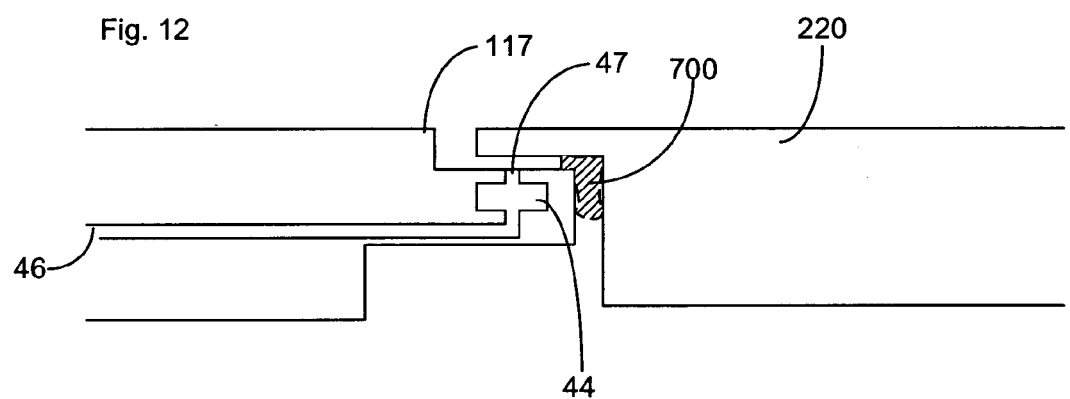
FIG. 12 illustrates an eighth embodiment of the present invention.

In the FIG. 12 version, the vacuum 46 is provided in the substrate table WT under an overhang portion of the object 220. The passage 47 is provided in an overhanging inwardly protruding portion of the substrate table WT. Optionally a bead of glue 700 is positioned at the inner most edge of the protruding portion between the substrate table WT and the object 220. If no bead of glue 700 is provided, a flow of gas from underneath the object 220 helps seal the gap between the sensor 220 and the substrate table WT.

Figure 13:
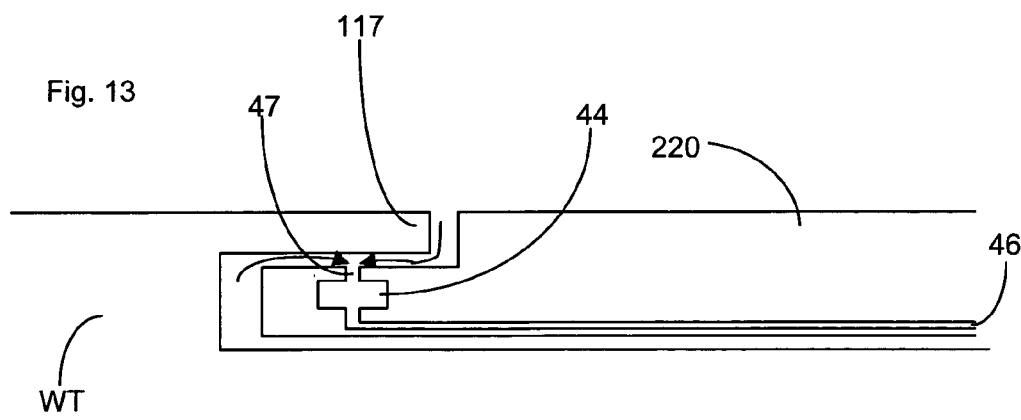
FIG. 13 illustrates a eighth embodiment of the present invention.

In the version of FIG. 13, the vacuum 46, compartment 44 and passage 47 are provided in the object 220 itself under an inwardly protruding edge seal member 117. Again there is the option of providing a bead of glue between the object 220 and the substrate table WT radially outwardly of the passage 47.

The shape of the edge seal member 117 and the top outer most edge of the object 220 can be varied. For example, it may be advantageous to provide an overhanging edge seal member 117 or indeed an outer edge of the object 220 which is overhanging. Alternatively, an outer upper corner of the object 220 may be useful.

Example of High NA Detection Sensor

Substrate-level sensors according to one or more embodiments of the invention may comprise a radiation-receiving element (1102, 1118) and a radiation-detecting element (1108, 1124) as shown in FIGS. 16–19. Exposure radiation is directed from the final element of the projection system PL through an immersion liquid 11 at least partly filling a space between the final element of the projection system PL and the substrate W. The detailed configuration of each of these elements depends on the properties of the radiation to be detected. The sensor at substrate level may comprise a photocell only, for use in cases where it is desirable for the photocell to receive the radiation directly. Alternatively, the sensor at substrate level may comprise a luminescence layer in combination with a photocell. In this arrangement, radiation at a first wavelength is absorbed by the luminescence layer and reradiated a short time later at a second (longer) wavelength. This arrangement is useful, for example, where the photocell is designed to work more efficiently at the second wavelength.

The radiation-receiving element (1112, 1118), which may be a layer with a pinhole, a grating or another diffractive element fulfilling a similar function, may be supported on top of a quartz sensor body 1120, i.e. on the same side of the body as the projection system. The radiation-detecting element (1108, 1124), in contrast, may be arranged within the sensor body 1120, or within a concave region formed on the side of the sensor body 1120 facing away from the projection system.

At boundaries between media of different refractive indices a proportion of incident radiation will be reflected and potentially lost from the sensor. For optically smooth surfaces, the extent to which this occurs depends on the angle of incidence of the radiation and the difference in refractive index of the media in question. For radiation incident at and above a "critical angle" (conventionally measured from normal incidence) total internal reflection may occur, leading to serious loss of signal to later elements of the sensor. This may be a particular problem in high NA systems where radiation may have a higher average angle of incidence. Accordingly, in an embodiment, arrangements are provided so that gas is excluded from the region between the radiation-receiving (1102, 1118) and radiation-detecting (1108, 1124) elements in order to avoid interfaces between media of high refractive index and gas.

In addition to losses due to partial and total internal reflection, absorption may also seriously reduce the intensity of radiation intensity reaching the photocell, as may scattering from interfaces that are not optically smooth.

Figure 16:
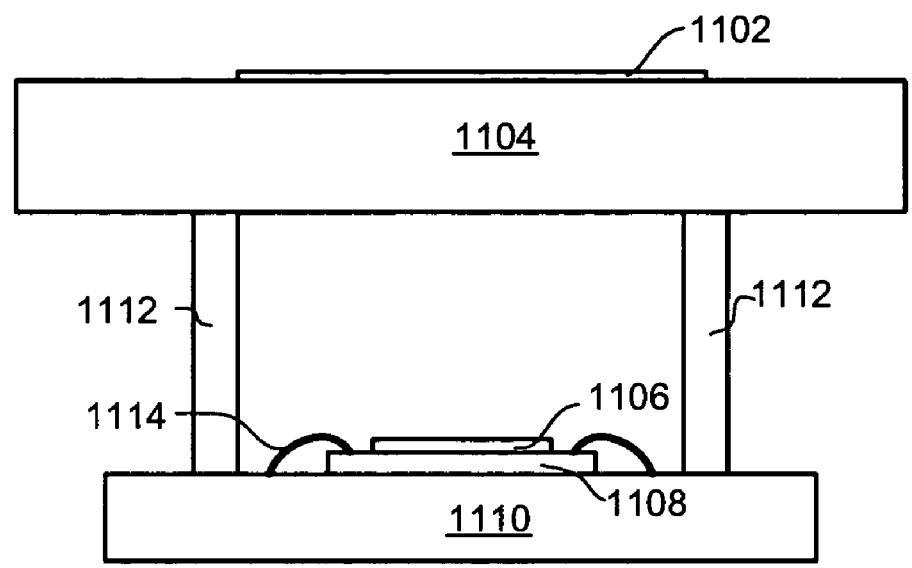
FIG. 16 depicts an ILIAS sensor module.

FIG. 16 shows an integrated lens interferometer and scanner (ILIAS) sensor module. This module has a shearing grating structure 1102 as a radiation-receiving element, supported by a transmissive plate 1104, which may be made of glass or quartz. A quantum conversion layer 1106 is positioned immediately above a camera chip 1108 (the radiation-detecting element), which is in turn mounted on a substrate 1110. The substrate 1110 is connected to the transmissive plate 1104 via spacers 1112 and bonding wires 1114 connect the radiation-detecting element to external instrumentation. A gas gap is located between the quantum conversion layer 1106 and the transmissive plate 1104. In a setup such as this designed for 157 nm radiation, for example, the gas gap within the sensor cannot easily be purged so that it will contain significant proportions of oxygen and water, which absorb radiation. Signal is therefore lost and the effect becomes worse for larger angles as these have a longer path length through gas. Thus, the dynamic range requirements for the sensor become more severe.

Figure 17:
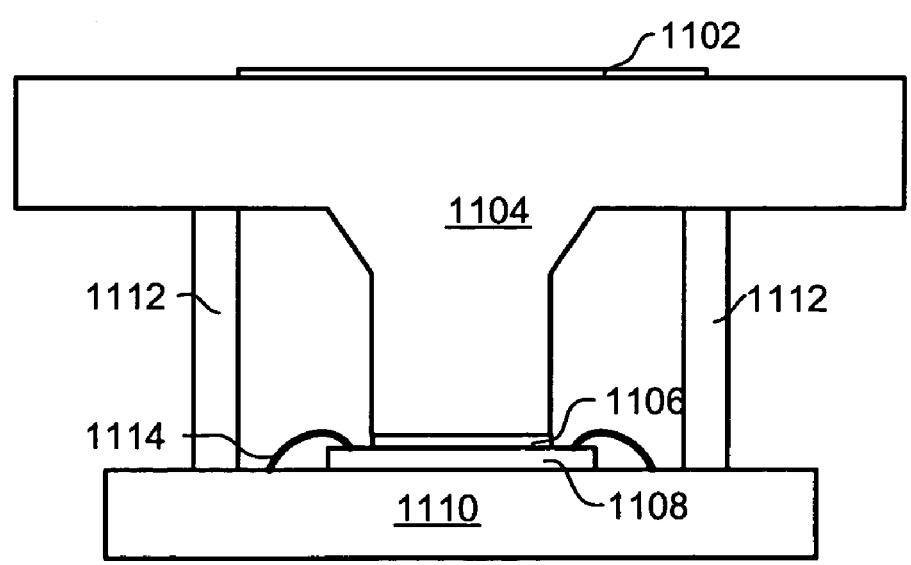
FIG. 17 depicts an ILIAS sensor module with an elongated transmissive plate according to an embodiment of the present invention.
Figure 18:
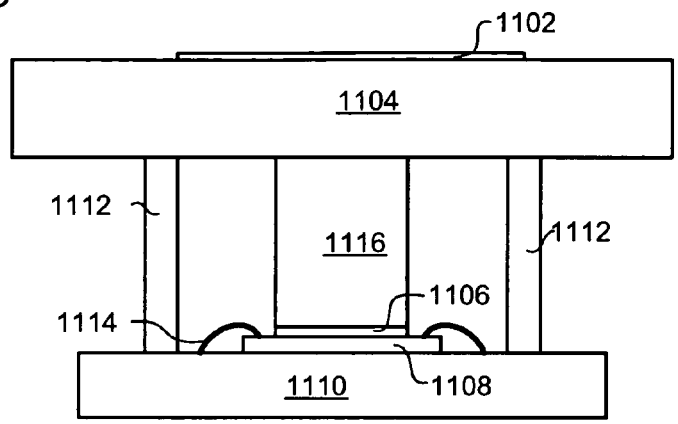
FIG. 18 depicts an ILIAS sensor module with a filler sheet according to an embodiment of the present invention.

FIGS. 17 and 18 show improved ILIAS sensor modules according to embodiments of the present invention. In FIG. 17, the gas gap has been removed by changing the shape of the transmissive plate 1104 to fit directly to the camera 1108.

This arrangement is made more difficult by the need to provide access for the bonding wires 1114 and necessitates an elongated form. From an engineering point of view, the alternative arrangement shown in FIG. 18 is easier to realize. Here, a filler sheet 1116 of the same material as the transmissive plate 1104, or of similar optical properties, is inserted between the transmissive plate 1104 and the quantum conversion layer 1106. The removal of the gas gap reduces transmission losses and relaxes dynamic range requirements (or, alternatively speaking, improves the effective dynamic range). Both arrangements improve refractive index matching and reduce the extent of spurious internal reflections at the interface with the transmissive plate 1104.

Figure 19A:
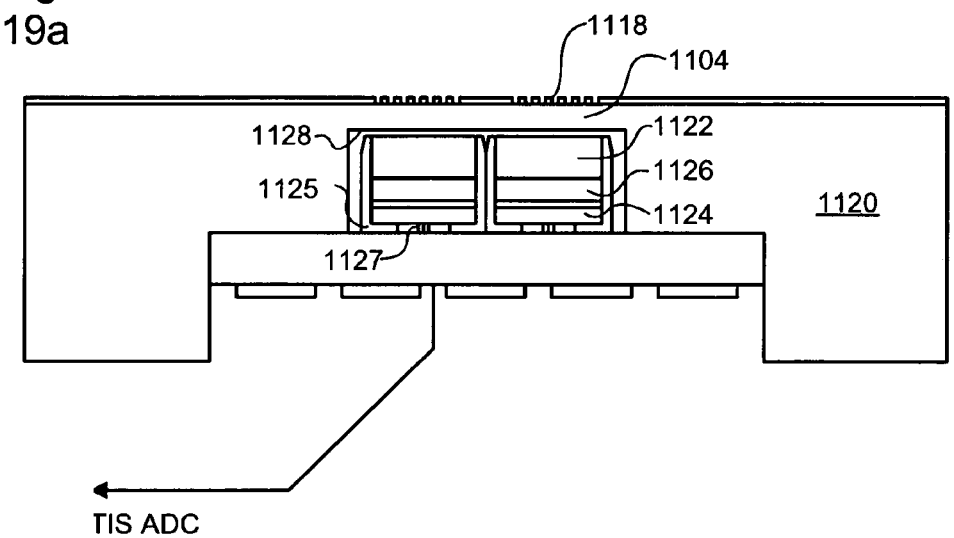
FIGS. 19a and 19b depict a luminescence based DUV transmission image sensor.
Figure 19B:
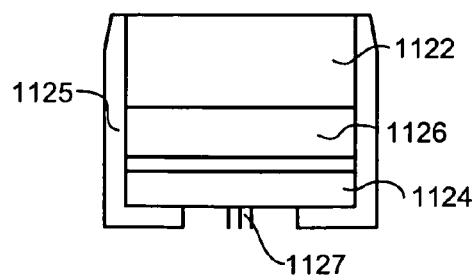

FIG. 19a shows a DUV transmission image sensor. FIG. 19b shows a magnified view of the processing element for clarity. The pattern of transmissive grooves 1118, constituting the radiation-receiving element in this case, is realized by means of e-beam lithography and dry etching techniques in a thin metal layer deposited on a substrate by means of sputtering. DUV radiation that is projected towards the grooves 1118 is transmitted by the transmissive plate 1104 (which may be quartz or fused silica) and hits the underlying luminescent material 1122, or "phosphor". The luminescent material 1122 may comprise a slab of crystalline material that is doped with rare-earth ions, e.g. yttrium-aluminium-garnet doped with cerium (YAG:Ce). The main purpose of the luminescent material 1122 is to convert the DUV radiation into more easily detectable visible radiation, which is then detected by the photodiode 1124. DUV radiation that has not been absorbed and converted into visible radiation by the phosphor 1122 may be filtered out before it reaches the photodiode 1124 (e.g. by a BG-39 or UG filter 1126).

In the above arrangement, gas may be present in the gaps between components mounted in the sensor housing 1125, yielding a number of gas/material/gas interfaces that interrupt the propagation of radiation. By considering the path of DUV radiation and radiation arising from luminescence, it is possible to identify regions where radiation is likely to be lost. The first region of interest is the rear-side 1128 of the transmissive plate 1104, reached by DUV radiation after it has passed through the grooves 1118 and transmissive plate 1104. Here, the surface has been formed by mechanical means, such as by drilling, and is inevitably rough on the scale of the wavelength of the radiation. Radiation may therefore be lost due to scattering, either back into the transmissive plate 1104 or out past the luminescent material 1122. Secondly, after this interface, the DUV light encounters the optically smooth gas/YAG:Ce interface, where a substantial amount of reflection may occur due to the refractive index mismatch, particularly in systems of high NA. Thirdly, the luminescent material 1122 emits radiation in random directions. Due to its relatively high refractive index, the critical angle for total internal reflection at a YAG:Ce/air boundary is around 33° (where, for example, there is air in the gap between the YAG:Ce and the filter 1126) from the normal, meaning that a large proportion of radiation incident on the boundary is reflected out of the system and lost through the side walls of the luminescent material 1122. Finally, the part of the luminescence that is directed towards the photodiode has to overcome the gas/quartz interface on the diode surface where surface roughness may again account for loss of detected signal.

Each of the embodiments may be combined with one or more of the other embodiments as appropriate. Further, each of the embodiments (and any appropriate combination of embodiments) can be applied simply to the liquid supply system of FIG. 2 and FIGS. 14 and 15 without the edge seal member 17, 117 as feasible and/or appropriate.

While specific embodiments of the invention have been described above, it will be appreciated that the invention may be practiced otherwise than as described. In particular, the invention is also applicable to other types of liquid supply systems, especially localised liquid area systems. If the seal member solution is used, it may be one in which a seal other than a gas seal is used. The description is not intended to limit the invention.

The invention claimed is:

1. A lithographic projection apparatus comprising:
   an illuminator adapted to condition an exposure beam of radiation;
   a support structure configured to hold a patterning device, the patterning device configured to pattern the exposure beam of radiation according to a desired pattern;
   a substrate table configured to hold a substrate;
   a projection system adapted to project the patterned beam onto a target portion of the substrate;
   a liquid supply system configured to at least partly fill a space between the projection system and an object on the substrate table, with a liquid; and
   a sensor configured to be in contact with the liquid capable of being positioned to be illuminated by a beam of radiation from the projection system or an alignment system once it has passed through the liquid,
   the substrate table having an edge seal member configured to at least partly surround an edge of the sensor and having a primary surface facing the projection system substantially co-planar with a primary surface of the sensor.

2. An apparatus according to claim 1, wherein the substrate table comprises a support surface configured to support an intermediary plate between the projection system and the sensor and not in contact with the sensor.

3. An apparatus according to claim 2, wherein the sensor comprises a transmission image sensor configured to sense the beam and wherein the intermediary plate is positionable between the sensor and the projection system.

4. An apparatus according to claim 1, wherein the sensor is on the substrate table.

5. An apparatus according to claim 1, wherein the sensor comprises an alignment sensor configured to align the substrate table relative to the projection system.

6. An apparatus according to claim 5, wherein measurement gratings of the alignment sensor have a pitch of less than 500 nm.

7. An apparatus according to claim 5, wherein the alignment sensor is configured to be illuminated obliquely.

8. An apparatus according to claim 1, wherein the sensor comprises a transmission image sensor.

9. An apparatus according to claim 1, wherein the sensor comprises a focus sensor.

10. An apparatus according to claim 1, wherein the sensor comprises a spot or dose sensor, an integrated lens interferometer and scanner, an alignment mark, or any combination of the foregoing.

11. An apparatus according to claim 1, wherein the beam of radiation from the projection system is the patterned beam.

12. An apparatus according to claim 1, wherein the alignment system comprises the sensor and is configured receive an alignment beam of radiation from the projection system to align the substrate table.

13. An apparatus according to claim 4, wherein the substrate table comprises a vacuum port configured to remove liquid from a space between the substrate table and the sensor.

14. An apparatus according to claim 4, comprising material in a space between the substrate table and the sensor configured to prevent entry of the liquid.

15. A device manufacturing method comprising:
projecting a beam of radiation from a projection system of a lithographic apparatus or an alignment system through a liquid onto a sensor in contact with the liquid; and
projecting a patterned beam of radiation using the projection system through the liquid onto a target portion of a substrate,
wherein a substrate table holding the substrate has an edge seal member configured to at least partly surround an edge of the sensor and has a primary surface facing the projection system substantially co-planar with a primary surface of the sensor.

16. A method according to claim 15, wherein the liquid is supported on an intermediary plate between the projection system and the sensor, the plate not being in contact with the sensor.

17. A method according to claim 16, wherein the sensor comprises a transmission image sensor configured to sense the beam and the intermediary plate is positionable between the sensor and the projection system.

18. A method according to claim 15, wherein the sensor is on a substrate table holding the substrate.

19. A method according to claim 15, wherein the sensor comprises an alignment sensor configured to align a substrate table holding the substrate relative to the projection system.

20. A method according to claim 19, wherein measurement gratings of the alignment sensor have a pitch of less than 500 nm.

21. A method according to claim 19, wherein the alignment sensor is configured to be illuminated obliquely.

22. A method according to claim 15, wherein the sensor comprises a transmission image sensor.

23. A method according to claim 15, wherein the sensor comprises a focus sensor.

24. A method according to claim 15, wherein the sensor comprises a spot or dose sensor, an integrated lens interferometer and scanner, an alignment mark, or any combination of the foregoing.

25. A method according to claim 15, wherein the beam of radiation from the projection system is the patterned beam.

26. A method according to claim 15, wherein the alignment system comprises the sensor and is configured receive an alignment beam of radiation from the projection system to align the substrate table.

27. A method according to claim 18, wherein the substrate table comprises a vacuum port configured to remove liquid from a space between the substrate table and the sensor.

28. A method according to claim 18, comprising providing material in a space between the substrate table and the sensor configured to prevent entry of the liquid.

* * * * *